United States Patent [19]

Breed et al.

[11] 4,138,530

[45] Feb. 6, 1979

[54] MAGNETIC STRUCTURES

[75] Inventors: Dirk J. Breed; Antonius B. Voermans; Hans Logmans, all of Eindhoven, Netherlands

[73] Assignee: U.S. Philips Corporation, New York, N.Y.

[21] Appl. No.: 810,105

[22] Filed: Jun. 27, 1977

[30] Foreign Application Priority Data

Jan. 17, 1977 [NL] Netherlands ........................ 7700419

[51] Int. Cl.$^{2}$ ............................................ G11C 11/02

[52] U.S. Cl. .................................... 428/539; 156/605; 156/606; 252/62.56; 252/62.57; 357/63; 365/3; 365/33; 428/900

[58] Field of Search ............... 156/605, 606, 610, 621; 428/539, 900; 360/131, 134, 135, 136; 340/174 R, 174 F, 174 EB; 252/62.56, 62.57, 62.58, 62.59, 62.6, 62.62, 62.61, 62.63, 62.64; 365/3, 33

[56] References Cited

U.S. PATENT DOCUMENTS 4,002,803 1/1977 Blunk .................................. 428/900
4,042,341 8/1977 Smeggil ................................ 428/900

FOREIGN PATENT DOCUMENTS 1477450 6/1977 United Kingdom.

OTHER PUBLICATIONS

Mat. Res. Bull., vol. 6, pp. 805–816, 1971.

*Primary Examiner*—Stanley S. Silverman
*Attorney, Agent, or Firm*—Carl P. Steinhauser

[57] ABSTRACT

A magnetic structure having a high magnetic bubble mobility which has the property that magnetic bubbles can be transported in it at very high velocities while using comparatively weak driving fields, comprising a substrate having a (110) oriented deposition surface on which a layer of rare earth — iron garnet with a substitution of $Mn^{3+}$ in iron lattice sites has been grown in compression in such a manner that the layer of rare earth-iron garnet has an orthorhombic anisotropy.

6 Claims, 3 Drawing Figures

MAGNETIC STRUCTURES

The invention relates to a magnetic structure suitable for the high velocity propagation of single-wall magnetic domains in the structure, the structure comprising a monocrystalline non-magnetic substrate having a lattice constant $a_1$ and having a surface bearing a layer of a monocrystalline magnetic material comprising a rare earth-iron garnet having a lattice constant $a_2$, which layer has been grown in compression on the substrate surface with an easy axis of magnetization substantially normal to the plane of the layer and with a medium axis of magnetization in the plane of the layer, the said substrate surface extending substantially parallel to a {110} face of the substrate.

For generating and propagating single-wall magnetic domains, in particular cylindrical domains ("bubbles") it is generally known to use a magnetic garnet material having an intrinsic anisotropy and/or a non-cubic uniaxial anisotropy (induced by strain or growth). This property is used for the formation of bubbles by ensuring that an induced easy axis of magnetization is substantially normal to the plane of the layer of magnetic material. It has been found, however, that for this class of materials the velocity at which magnetic bubbles can be moved is in practice subject to certain restrictions. It has been found that a so-called "saturation" velocity of approximately 10 m/sec occurs at comparatively low values of the applied magnetic drive field. From an abstract of a lecture given at the International Conference on Magnetic Bubbles (13–15 September 1976; Eindhoven) and entitled "Increased domain wall velocities via an orthorhombic anisotropy in garnet epitaxial films", it is known that in order to increase the propagation velocity, garnet layers are used having an orthorhombic anisotropy. In layers having an orthorhombic anisotropy there are two "hard" axes of magnetization with different degrees of "hardness" in the plane of the layer. These axes are often referred to as the "medium " axis and the "hard" axis. The anisotropy in the plane of the layer which results therefrom proves to have the same velocity-increasing effect as the application of an external magnetic field acting in the plane of the layer. (Such a field is however unsuitable for a number of magnetic bubble applications.) During investigations which led to the present invention, it was found that in known garnet layers having an orthorhombic anisotropy which are composed of $(Eu, Lu)_3(FeAl)_5O_{12}$, although in such layers magnetic bubble velocities of 400 m/sec can be realized, which was previously not possible, magnetic fields of well over 100 Oersted have to be applied for this purpose so as to provide the driving forces.

It is the object of the invention to provide garnet materials having an orthorhombic anisotropy which enables the propagation of magnetic bubbles at very high velocities (higher than 10 m/s) when using comparatively weak driving fields.

The invention provides a magnetic structure suitable for the high velocity propagation of single-wall magnetic domains in the structure, the structure comprising a monocrystalline non-magnetic substrate having a lattice constant $a_1$ and bearing a layer of a monocrystalline magnetic material comprising a rare earth (as hereinafter defined) iron garnet having $Mn^{3+}$ and/or $Ru^{3+}$ ions substituted in iron lattice sites and having a lattice constant $a_2$, which layer has been grown in compression on a surface of the substrate with an easy axis of magnetisation substantially normal to the plane of the layer and having a medium magnetisation axis in the plane of the layer, the said surface of the substrate extending substantially parallel to a {110} face of the substrate. As will be explained hereinafter, magnetic bubble velocities are possible in the layers according to the invention which are comparable to those in the known orthorhombic layers, whereas they have the important advantage that, due to the higher mobility of magnetic bubbles in layers according to the invention, the magnetic drive fields to be applied for achieving said velocities may be comparatively weak.

As a result of the growth in compression of a garnet layer on a {110} surface of a substrate, a layer having an orthorhombic symmetry can be obtained in which the product of the magnetostriction constant of the layer material and the difference between the lattice constants of the substrate and the layer grown on top of it, the socalled "misfit", determines the desired anisotropy. If $Mn^{3+}$, which provides a large contribution to the magnetostriction constant, is substituted in iron lattice sites in the usual bubble garnet materials, the difference in lattice constants of the substrate and the layer grown on top of it ("misfit") need not be large, which facilitates the growth process. Experiments have shown that, depending on the quantity of $Mn^{3+}$ which is substituted, a "misfit" of $-1 \times 10^{-3}$ already satisfies the imposed requirements (orthorhombic anisotropy and domain formation).

In order to ensure in the case of strain induced anisotropy that the easy axis of magnetization is oriented normal to the plane of the magnetic layer grown in compression, the quantity of substituted Mn is preferably such that in the general formula $R_3Fe_{5-y}Mn_yO_{12}$, $y \geqq 0.15$.

(It is noted that on theoretical bases $Ru^{3+}$ may be deemed to fulfil the same function as $Mn^{3+}$.)

The contribution in the magnetostriction constant by $Mn^{3+}$ and $Ru^{3+}$ substitution is so large that only little of it need be introduced into the garnet material. This means that the properties of the garnet material which are important for device applications, such as magnetization, damping and coercive field, are not significantly influenced by the substitution. For example, $Mn^{3+}$-substituted gadolinium-lutetium-iron garnet layers have already been manufactured with a coercive field of approximately 0.02 Oersted, which is an attractively low value for device applications. Ferromagnetic reasonance measurements have demonstrated that the damping contribution of the $Mn^{3+}$ ion in this type of layers is negligibly small.

Thus $Mn^{3+}$ or $Ru^{3+}$ substituted garnet layers having the desired orthorhombic anisotropy can be grown from all the current rare earth-iron-garnet compositions used for magnetic bubble applications. Throughout this specification the term "rare earth" is used to denote an element having an atomic number of 39 or of from 57 to 71 inclusive.

For each specific application a composition may be chosen which has the properties most suitable for said application; said properties hardly change by the substitution of $Mn^{3+}$ or $Ru^{3+}$. Compositions which have proved to be suitable for magnetic bubble applications are, for example, $(Y,Eu)_3Fe_5O_{12}$; $(Yb,Eu)_3Fe_5O_{12}$; $(Yb,Sm)_3Fe_5O_{12}$; $(Lu,Eu)_3Fe_5O_{12}$; $(Tm,Eu)_3Fe_5O_{12}$; $(Y,Tm,Eu)_3Fe_5O_{12}$; $(Y,Yb,Eu)_3Fe_5O_{12}$; $(Lu,Sm)_3Fe_5O_{12}$; $(Yb,Tm,Eu)_3Fe_5O_{12}$; $(Yb,Lu,Sm)_3Fe_5O_{12}$;

$(Y,Tm,Sm)_3Fe_5O_{12}$; $(Y,Lu,Eu)_3Fe_5O_{12}$; $(Sm,Tm)_3Fe_5O_{12}$; $(La,Lu)_3Fe_5O_{12}$.

In order to adjust the value of the saturation magnetization, it may furthermore be necessary to "dilute" said compositions with a non-magnetic ion. Al and Ga, and combinations of Ca or Sr with Ge or Si, respectively, are suitable for this purpose.

BRIEF DESCRIPTION OF THE DRAWING

Some embodiments of the invention will now be described with reference to the following Examples and the accompanying drawing, in which.

The growth process

Figure 1:
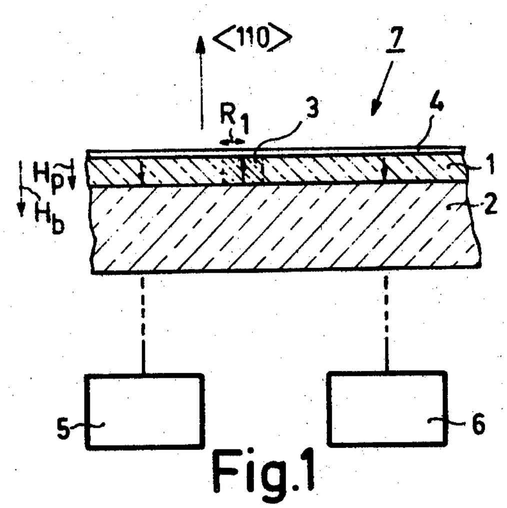
FIG. 1 is a sectional elevation of a part of a magnetic structure in which the principles of the invention are embodied.

A bubble layer 1 (FIG. 1) can be grown epitaxially on a substrate 2 while using a growth method such as chemical vapor deposition (CVD) or liquid phase epitaxy (LPE). LPE is particularly suitable for the growth of garnet layers having an easy axis of magnetization which is normal to the plane of the layer.

The LPE growth occurs as follows. A platinum crucible having capacity of 100 cc, is placed in a furnace and contains a $PbO$-$B_2O_3$ melt in which the required oxides for the growth of the layer have been dissolved. The contents of the crucible are heated and stirred to above the saturation temperature and are then cooled to the growth temperature. A gadolinium-gallium garnet substrate sawn and polished in an orientation which provides a desired deposition surface, is placed in a platinum holder and is dipped into the melt for a certain period of time. Either the horizontal or the vertical dipping method may be used. There is generally no stirring during the growth process in the vertical dipping method, whereas the melt is stirred during growth in the horizontal dipping method. When the thickness of layer grown on the substrate is sufficient, the substrate is withdrawn from the melt. Flux residues, if any, may be removed by means of a dilute mixture of nitric acid and acetic acid.

A number of layers which satisfy the general composition: $(Gd,Lu)_3\,(Fe, Mn^{3+},Al)_5O_{12}$ were grown in the above-described manner.

Although this composition does not provide an optimum bubble material, it has been chosen because it can be grown easily for the purpose of the invention.

A characteristic example for the growth of a layer on the basis of the above-mentioned composition is provided by the following example.

EXAMPLE

For the growth on a {110} oriented face of a gadolinium gallium substrate of a layer having the composition: $Gd_{2.1}Lu_{0.9}Fe_{4.4}Mn^{3+}{}_{0.35}Al_{0.25}O_{12}$, a melt was composed which contained the following oxides:

400 g $PbO$
10 g $B_2O_3$
30 g $Fe_2O_3$
5 g $MnO_2$
2.5 g $Gd_2O_3$ 1.15g $Lu_2O_3$
0.7 g $Al_2O_3$.

Figure 2:
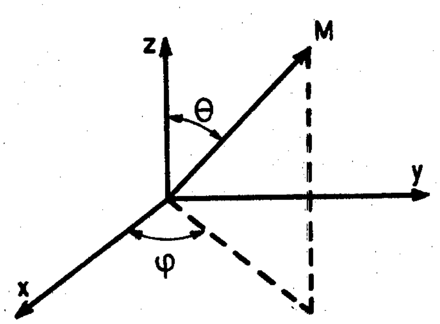
FIG. 2 shows a system of co-ordinates in which orthorhombic anisotropy is defined.

The temperature at which the substrate providing a (110)-oriented deposition surface was dipped vertically in the melt for 25 minutes was 820° C. The thickness of the grown layer was 2.3 μm, the "misfit" $(a_1 - a_2)/a_1$ was $-2.5 \times 10^{-3}$. The following magnetic properties were measured:

$4\,\pi\,M_s = 169$ Gauss
$1 = 1.14\ \mu m$
$Q_1 = K_u/2\pi M_s^2 = 24.6$
$Q_2 = \Delta/2\Delta M_s^2 = 40.5$
$H_c = 0.7$ Oersted.c FIG. 2 shows the system of co-ordinates with reference to which orthorhombis anisotropy is usually defined.

The magnetic anisotropy energy F can be written as:

$$F = K_u \sin^2 74 + \Delta \sin^2 \theta \sin^2 \phi$$

where $K_u$ represents the difference in energy between the easy axis z and the medium axis x, while $\Delta$ represents the difference in energy between the medium axis x and the hard axis y. $\theta$ and $\phi$ denote the orientation of the magnetization M.

The velocity measurement

The domain wall velocity was measured by means of the so-called "bubble collapse" technique (See A. H. Bobeck et al., Proceedings 1970 Ferrites Conference, Kyoto, Japan, page 361). In this technique the bias field $H_b$ (FIG. 1) necessary to form a stable magnetic bubble 3 was increased by means of a field pulse $H_p$ in such manner that the total field has a value which exceeds the static collapse field. During the field pulse, the radius of the bubble 3 decreases from its original value $R_1$ to a smaller value $R_2$ which is determined by the width of the pulse. When, at the instant the pulse field $H_p$ is terminated, the radius $R_2$ of the bubble domain exceeds the radius $R_o$ at which it becomes unstable, the bubble will expand again until it has achieved its original radius $R_1$. When, at the instant the pulse field is terminated, $R_2$ is smaller than $R_o$, the bubble will continue collapsing and will finally disappear. Associated with a given pulse amplitude is a critical pulse width in which $R_2$ is exactly equal to $R_o$. This pulse width is termined the bubble collapse time $\tau$.

Figure 3:
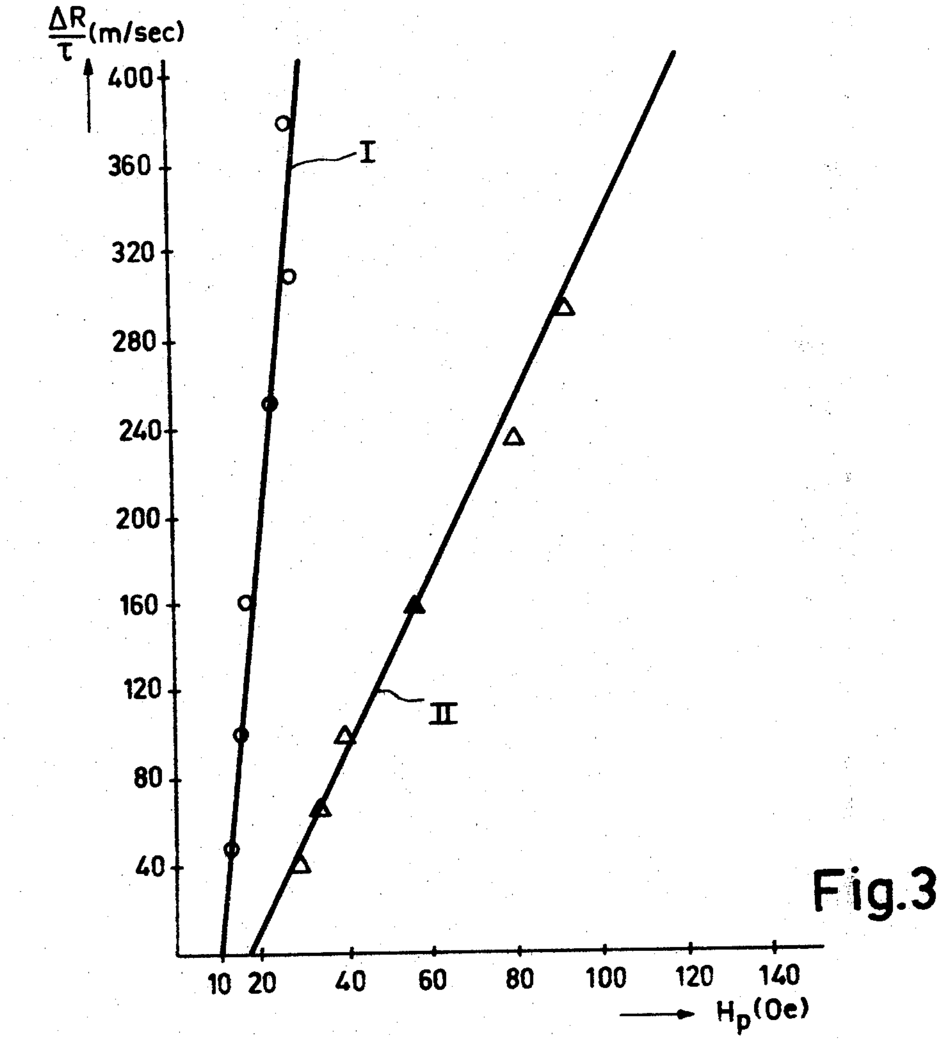
FIG. 3 shows a graphic representation of the dependence of the domain wall velocity $\Delta R/\tau$ (in m/sec) on an applied pulse field $H_p$ (in Oersted) for a magnetic structure according to the invention (I), compared with a known magnetic structure (II).

In practice, a fixed value of the bias field $H_b$ is always used for a certain series of measurements. In the present case it was 10 Oersted below that of the collapse field in the measurements in the magnetic structure according to the invention, and 24 Oersted below that of the collapse field in the measurements in a known magnetic structure having a bubble layer with orthorhombis anisotropy. For a number of different pulse amplitudes the collapse time distribution is determined for a number of simultaneously generated magnetic bubbles. The domain wall velocity is given by $\Delta R/\tau$, where $\Delta R = R_1 - R_o$. In FIG. 3 in which the domain wall velocity $\Delta R/\tau$ in meters per second is plotted on the vertical axis and the pulse amplitude $\Delta H_p$ in Oersted is plotted on the horizontal axis, the results of a number of velocity measurements are shown which are performed on the one hand on layers according to the invention (curve I) oriented with the easy axis in the (110) direction, and on the other hand in rare earth iron garnet layers of a composition without Mn and/or Ru, but also oriented with the easy axis in the (110) direction (curve II).

The values of $R_1$ and $R_o$ were calculated on the basis of material parameters.

In this connection it is to be noted that an analysis of the bubble collapse technique has been published by Dorleyn and Druyvesteijn in Applied Physics, 1, pages 167 (1973).

Referring now to FIG. 3, it is to be noted that it is clearly demonstrated that magnetic bubble structures of the type according to the invention makes it possible to achieve domain wall velocities of approximately 400 m/sec (curve I) with applied fields having a field strength of 30 Oersted, which field strength is considerably lower than that which is necessary in the known magnetic structure having orthorhombic anisotropy to achieve comparable velocities. Otherwise, in both measurements a bias field was used having a field strength which was between the collapse field and the run-out field.

The mobility of the bubbles in the relevant bubble structures can be derived from the slope of the two curves. A mobility of 4.1 $m.sec^{-1}$ $Oe^{-1}$ follows from curve II and a mobility of 19 $m.sec^{-1}$ $Oe^{-1}$ follows from curve I. In the magnetic structure according to the invention the mobility is thus well over four times as large as that in the known magnetic structure described having orthorhombid anisotropy.

The measurements have not been performed at higher field strength of the applied field than is shown in FIG. 3, so that the range where the so-called saturation velocity occurs is not reached. However, it can be calculated from the resulting data that a peak velocity of approximately 1500 m/sec can be achieved in the magnetic structures according to the invention as compared with a peak velocity of approximately 1300 m/sec in the known magnetic structure. (For comparison, the peak velocity in known magnetic structures without orthorhombic anisotropy is approximately 70 m/sec). In themselves these values are of importance more theoretically than practically. However, the higher the peak velocity, the higher also the saturation velocity.

A second series of experiments comprised the growth of layers on the basis of the general composition $(LaY)_3(Fe\ Mn\ Ga)_5O_{12}$ on a (110)-oriented face of a gadolinium gallium garnet substrate.

For the growth process which took place in the same manner as the above-described growth process, a melt was composed of 375 g PbO
9.4 g $B_2O_3$
24.8 g $Fe_2O_3$
3.32g $Y_2O_3$
1.6 g $La_2O_3$
2 g $Mn_2O_3$
1.5 g $Ga_2O_3$ The growth temperature was 865° C. The grown layer showed a "misfit" of $-1.2 \times 10^{-3}$ and magnetic bubbles could be realized in it to prove that also in this type of composition the combination of growth on a {110}-oriented face and substitution of $Mn^{3+}$ in Fe-sites results in the desired anisotropy.

What is claimed is:

1. A magnetic structure suitable for the high velocity propagation of single-wall magnetic domains in the structure comprising a monocrystalline non-magnetic substrate having a lattice constant $a_1$ and having a surface bearing a layer of a monocrystalline magnetic material of the composition $R_3\ Fe_{5-y}\ M^{3+}{}_y\ O_{12}$, R being a rare earth including yttrium, M is manganese or ruthenium and $y \geqq 0.15$, the $Mn^{3+}$ and/or $Ru^{3+}$ ions being substituted in iron lattice sites, and having a lattice constant $a_2$ which layer has been grown in compression on a surface of the substrate with an easy axis of magnetization substantially normal to the plane of the layer and with a medium axis of magnetization in the plane of the layer, the said surface of the substrate extending substantially parallel to a {110} face of the substrate.

2. A magnetic structure as claimed in Claim 1 wherein $(a_1 - a_2/a_2) \leqq -1 \times 10^{-3}$.

3. A magnetic structure as claimed in claim 1, wherein the substrate has a garnet composition and the magnetic material has a composition defined by the general formula $(R)_3(Fe\ X^{3+}\ B)_5O_{12}$, wherein R is a rare earth metal including yttrium, B is A1 and/or Ga, and X is Mn and/or Ru.

4. A magnetic structure as claimed in claim 3, wherein the substrate consists of $Gd_3Ga_5O_{12}$ and the magnetic material is $(Gd\ Lu)_3(Fe\ Mn\ Al)_5O_{12}$.

5. A magnetic structure as claimed in claim 1, wherein the substrate has a garnet composition and that the magnetic layer has a composition defined by the general formula $(R\ C)_3\ (Fe\ X^{3+}\ D)_5O_{12}$, wherein R is a rare earth including yttrium
C is Ca and/or Sr,
D is Ge and/or Si, and
X is Mn and/or Ru.

6. A magnetic structure as claimed in claim 1, wherein the layer of the monocrystalline magnetic material has been grown on the said surface of the substrate by means of liquid phase epitaxy.

* * * * *